United States Patent
Shoki et al.

[11] Patent Number: 6,127,068
[45] Date of Patent: Oct. 3, 2000

[54] X-RAY MEMBRANE FOR X-RAY MASK, X-RAY MASK BLANK, X-RAY MASK, MANUFACTURING METHOD THEREOF AND METHOD OF POLISHING SILICON CARBIDE FILM

[75] Inventors: Tsutomu Shoki, Hachioji; Kesahiro Koike, Ohizumi-mura, both of Japan

[73] Assignee: Hoya Corporation, Japan

[21] Appl. No.: 09/052,352

[22] Filed: Mar. 31, 1998

[30] Foreign Application Priority Data

Mar. 31, 1997 [JP] Japan ................................. 9-080740

[51] Int. Cl.[7] ................................. G03F 9/00; G21K 5/00
[52] U.S. Cl. ................................. 430/5; 378/35
[58] Field of Search ................................. 430/5; 378/34, 378/35; 428/432

[56] References Cited

U.S. PATENT DOCUMENTS

| | | | |
|---|---|---|---|
| 5,005,075 | 4/1991 | Kobayashi et al. | 378/35 |
| 5,178,977 | 1/1993 | Yamada et al. | 430/5 |
| 5,958,627 | 11/1999 | Shoki | 430/5 |
| 5,989,755 | 11/1999 | Shoki | 430/5 |

FOREIGN PATENT DOCUMENTS 7-75219   8/1995   Japan .

OTHER PUBLICATIONS

English language abstract: Japanese Laid–Open Patent No. 7–75219.

Yamaguchi, Y.I. et al, "Properties of SiC Film as X–Ray Mask Membrane," Materials Research Laboratory, Hoya Corporation, pp. 197–210.

*Primary Examiner*—S. Rosasco
*Attorney, Agent, or Firm*—Cook, Alex, McFarron, Manzo, Cummings & Mehler, Ltd.

[57] ABSTRACT

A surface of a silicon carbide film which is an x-ray membrane 12 is made so that the surface roughness thereof may be 1.0 nm or less in terms of Ra (center-line average roughness) and the surface may have no scratch of 0.25 μm or more in width. The surface of the silicon carbide film, which is the x-ray membrane 12 is polished a diamond particle, of a predetermined particle diameter, and colloidal silica dispersed in a solution containing hydrogen peroxide as an abrasive material, so that the surface is highly precise.

9 Claims, 2 Drawing Sheets

1 X-RAY MASK

2 X-RAY MASK BLANK

X-RAY MEMBRANE FOR X-RAY MASK, X-RAY MASK BLANK, X-RAY MASK, MANUFACTURING METHOD THEREOF AND METHOD OF POLISHING SILICON CARBIDE FILM

REFERENCE TO RELATED APPLICATION

This application claims the priority right under 35 U.S.C 119, of Japanese Patent Application No. Hei 09-80740 filed on Mar. 31, 1997, the entire disclosure of which is incorporated herein by reference.

BACKGROUND OF THE INVENTION

1. Field of the Invention

The present invention relates to an x-ray mask blank, an x-ray mask in which a silicon carbide film is used as an x-ray membrane, a method of manufacturing the same, and a method of polishing the silicon carbide film.

2. Description of the Related Art

In the semiconductor industry, as a well known technique for forming an integrated circuit, constituted of a fine pattern on a silicon substrate or the like, uses a photolithography method for transferring the fine pattern, with visible light and ultraviolet light used as an exposing electromagnetic wave. However, a recent advance in a semiconductor technique greatly promotes a high integration semiconductor device, such as VLSI, and this requires that the fine pattern be transferred with high accuracy beyond the transfer limit (a principled limit due to a wavelength) of visible light and ultraviolet light, for use in the conventional photolithography method. To transfer such a fine pattern, an x-ray lithography method uses an x-ray having a wavelength that is shorter than the wavelength of visible light and ultraviolet light.

FIG. 1 is a cross sectional view showing a structure of an x-ray mask for use in the x-ray lithography. FIG. 2 is a cross sectional view showing an example of an x-ray mask blank structure as an intermediate product obtained in an intermediate process during the manufacturing of the x-ray mask.

As shown in FIG. 1, an x-ray mask 1 comprises an x-ray membrane 12, for transmitting the x-ray, and an x-ray absorbing film pattern 13a formed on the x-ray membrane 12. The x-ray membrane 12 is supported by a silicon frame body 11a which is formed by removing the inner portion so that only the periphery of the silicon substrate remains. When the x-ray mask 1 is manufactured, the x-ray mask blank is manufactured in the intermediate process as an intermediate product. The x-ray mask blank is further processed, and the x-ray mask is obtained. In this industry, although, of course, the x-ray mask, which is a finished product, is to be dealt in, and the x-ray mask blank, which is the intermediate product, is also often to be independently dealt in.

As shown in FIG. 2, an x-ray mask blank 2 comprises the x-ray membrane 12 formed on a silicon substrate 11 and an x-ray absorbing film 13 formed on the x-ray membrane.

Silicon nitride, silicon carbide, diamond or the like may generally be used as the x-ray membrane 12. An amorphous material, including tantalum (Ta), having an excellent resistance to x-ray radiation is often used as the x-ray absorbing film 13.

The following method may be used for manufacturing the x-ray mask 1 from the x-ray mask blank 2. A resist film on which a desired pattern is formed is arranged on the x-ray mask blank 2, shown in FIG. 2. This pattern is then used as a mask, so as to perform a dry etching so that the x-ray absorbing film pattern is formed. After that, a center area, formed on a rear surface and to be a window area of the x-ray membrane 12, is removed by a reactive ion etching (RIE) using 4-fluorocarbon ($CF_4$) as etching gas. The remaining film (12a: see FIG. 1) is then used as the mask so as to etch the silicon by an etching liquid constituted of a mixed liquid of fluoric acid and nitric acid, whereby the x-ray mask 1 (see FIG. 1) is obtained. In this case, an electron beam (EB) resist is generally used as the resist, and the pattern is formed by means of an EB lithography.

The x-ray membrane 12 requires a high transmittance to an x-ray, a high Young's modulus of elasticity, a proper tensile stress, a resistance to x-ray radiation, high transmittance within a visible light range, and the like. These characteristics will be described below. The transmittance to the x-ray is required during exposure. The higher the transmittance, the shorter the exposure time can. This is effective for improving throughput. The Young's modulus of elasticity influences the strength of the film and the deformation of an absorber pattern. The higher the Young's modulus of elasticity, the higher the film strength becomes. This is effective for suppressing misalignment. A proper tensile stress is needed so the film is self-supported. Resistance to x-ray radiation is required so that no damage results from x-ray radiation, because the x-ray membrane is irradiated with the x-ray during exposure. With regard to the transmittance within the visible light range, because an alignment of the mask attached to an x-ray stepper and a wafer is accomplished by the use of a light source within the visible light range, the high transmittance to an alignment light source is needed in order to achieve a highly accurate alignment. Furthermore, a smooth film surface is required. Surface smoothness is needed so that a highly accurate pattern may be formed on the absorber.

In order to satisfy these requirements, various materials and manufacturing methods have been studied. Since silicon carbide has the highest Young's modulus of elasticity and causes no damage due to the x-ray in the silicon nitride, the silicon carbide (SiC) and the diamond which have been heretofore used as the x-ray membrane, it may safely be said that the silicon carbide is the most promising material. However, because the SiC film has a polycrystalline structure, the SiC film has a film surface which is rougher than 6 nm (Ra: a center-line average roughness) due to its crystalline structure. For smoothing the surface of this SiC film, an etch back method and a mechanical polishing method are carried out after film formation. The etch back method is the technique in which the rough SiC film is coated with the resist. The thus obtained smooth resist surface is transferred onto the SiC film by dry etching. The mechanical polishing is the method in which a hard grain, such as the diamond and alumina, is used as an abrasive material so as to physically grind an unevenness on the surface of the SiC film. For example, according to Japanese Patent Publication No. 7-75219, the surface roughness of 20 nm or less is obtained by the etch back and mechanical polishing. Although a definition of surface roughness is not clear in this publication, such roughness is expected to be a maximum height (Rmax) and corresponds to about 2 nm or less in terms of Ra.

Recently, due to advances in photolithography an introduction of the x-ray lithography has been performed later. At present, the introduction from a generation of 1 G bit-DRAM (design rule: 0.18 $\mu$m) is anticipated. Even if the x-ray lithography is introduced from 1 G, the x-ray lithography is characterized in that it can be used through a plurality of generations up to 4 G, 16 G and 64 G. Assuming that x-ray lithography is used for 64 G, position precision required for the x-ray mask becomes severer, and the position precision is required to be as high as 10 nm. Furthermore, the mask pattern is required to have no defect regardless of pattern size. Although the pattern defect can be corrected by a defect correcting unit, the number of practically correctable defects is limited to about 10 or less on the mask surface. A factor causing pattern defect is the defect of the x-ray absorbing film. More specifically, an important factor is the defect of the x-ray membrane. That is, if the defect (a contaminant or the like) is caused on the membrane, the defect is also inherited on the absorbing film formed on the membrane. Moreover, this faulty absorbing film causes the pattern defect after a mask processing. Therefore, it is necessary to exactly check defects on the x-ray membrane and to process so that no defect or the least defect may be on the membrane. A minimum defect size affecting the pattern defect corresponds to the width of the minimum pattern line. Therefore, for the x-ray mask, it is necessary to exactly check the defect size to about 0.2 $\mu$m.

To check for defects, a laser light is used in a method for detecting the light scattering from any surface defect. For example, by Surf scan 6220 (KLA Tencor), a minimum sensitivity of 0.09 $\mu$m can be realized on a silicon wafer. However, in such a surface defect checking unit using a laser light, the level of sensitivity for detecting the defect is influenced by surface roughness. Therefore, if the surface is rough, the roughness causes the light to scatter. Thus, fine defects cannot be recognized (distinguished). The inventors have repeated experiments as to the surface roughness and the size of the defect to be detected. As a result, in order to exactly evaluate a defect of 0.2 $\mu$m, it is confirmed that surface roughness must be 1.0 nm (Ra) or less. However, when the etch back method is used, although a roughness of 2 nm or less is obtained, the smooth surface of 1 nm or less can be scarcely obtained. On the other hand, in the mechanical polishing method, since the SiC film is a very hard film, the film can be scarcely ground by a soft abrasive particle such as silica, in general. By the use of a hard abrasive material such as a diamond, a smooth surface of 1 nm or less can be obtained. However, it has been confirmed that the use of a diamond particle easily causes a scratch on the surface. It is confirmed that such a scratch of a certain size or more causes not only a reduction of the film strength but also breakage (defect) of the fine pattern.

SUMMARY OF THE INVENTION

It is therefore an object of the present invention to provide an x-ray membrane for an x-ray mask and an x-ray mask blank, available for manufacturing the x-ray mask, that is capable of high-precision pattern transfer, and an x-ray mask manufactured by the use of the x-ray membrane and the x-ray mask blank.

Another object of the present invention is to provide a method of manufacturing a silicon carbide film use as the x-ray membrane of the x-ray mask blank and the x-ray mask.

A further object of the present invention is to provide a method of manufacturing the x-ray mask blank and the x-ray mask through the method of manufacturing the silicon carbide film.

In accordance with the first aspect of the present invention, there is provided an x-ray membrane for an x-ray mask comprising a silicon carbide film having a surface roughness of 1.0 nm or less in terms of Ra (center-line average roughness) and having no scratch width of 0.25 $\mu$m or more.

In accordance with the second aspect of the present invention, there is provided an x-ray mask blank having an x-ray membrane and an x-ray absorbing film on a substrate. A silicon carbide film having a surface roughness of 1.0 nm or less, in terms of Ra (center-line average roughness), and having no scratch of 0.25 $\mu$m or more in width is used as the x-ray membrane.

In accordance with the third aspect of the present invention, there is provided an x-ray mask on which an x-ray absorbing film pattern is formed on an x-ray membrane supported by a frame body. A silicon carbide film having the surface roughness of 1.0 nm or less in terms of Ra (center-line average roughness) and having no scratch of 0.25 $\mu$m or more in width is used as the x-ray membrane.

In accordance with the fourth aspect of the present invention, there is provided a method of polishing a silicon carbide film with an abrasive material. A diamond having an average particle diameter of 0.05–0.3 $\mu$m is used as the abrasive material. The surface of the silicon carbide film is polished so that the surface may have a roughness of 1.0 nm or less in terms of Ra (center-line average roughness) and substantially have no scratch of 0.25 $\mu$m or more in width.

In accordance with the fifth aspect of the present invention, there is provided a method of polishing a silicon carbide film using an abrasive material. The surface of the silicon carbide film is polished using an abrasive material constituted of a diamond with an average particle diameter of 0.05–0.6 $\mu$m and The surface is then polished using an abrasive material constituted of colloidal silica, whereby surface of the silicon carbide film is polished so that the surface may have the roughness of 1.0 nm or less in terms of Ra (center-line average roughness) and substantially have no scratch of 0.25 $\mu$m or more in width.

In accordance with the sixth aspect of the present invention, there is provided a method of polishing a silicon carbide film using an abrasive material. The surface of the silicon carbide film is polished with colloidal silica dispersed in solution containing hydrogen peroxide ($H_2O_2$) as the abrasive material, whereby the surface of the silicon carbide film is polished so that the surface may have a roughness of 1.0 nm or less in terms of Ra (center-line average roughness) and substantially have no scratch of 0.25 $\mu$m or more in width.

In accordance with the seventh aspect of the present invention, there is provided a method of manufacturing an x-ray mask blank comprising the steps of: forming a silicon carbide film as an x-ray membrane on a substrate; and polishing the surface of the silicon carbide film, wherein the method of polishing the silicon carbide film is according to any one of the first through sixth aspects.

In accordance with the eighth aspect of the present invention, there is provided a method of manufacturing an x-ray mask comprising the steps of: forming a silicon carbide film as an x-ray membrane on one surface of a substrate; polishing the surface of the silicon carbide film; forming an x-ray absorbing film on the polished surface of the silicon carbide film; selectively removing one part of the x-ray absorbing film and forming an x-ray absorbing film pattern; and removing a portion including an area coverage in which the x-ray absorbing film pattern is formed on the substrate and forming the substrate in the shape of a frame body, wherein the method of polishing the silicon carbide film according to any one of the fourth through sixth aspects is used.

A study of the inventors shows that a silicon carbide film having the surface roughness of 1 nm (Ra: the center-line average roughness) or less and having no straight scratch of 0.25 μm or less in width on the surface thereof has a high film strength. The study further shows that, when this silicon carbide film is used as the x-ray membrane, an x-ray mask of the least defect is obtained, even if a fine defect of about 0.2 μm is regarded as being included in the defect. That is, the x-ray mask is required to have a reduced defect and high film strength. For example, the x-ray mask for 1 G bit-DRAM, having a design rule pattern of 0.18 μm required for an x-ray lithography, needs to suppress a pattern defect to 10 or less before being corrected. For this purpose, it is necessary to also evaluate a size of the defect of 0.2 μm. It is also found that, since the film strength is influenced by the degree of the scratch on the x-ray membrane, minimization of the scratch is important to suppress a reduction of the film strength. It is then found that the x-ray membrane is required to have surface roughness of 1 nm (Ra: the center-line average roughness) or less and have no straight scratch of 0.25 μm or less in width, on the surface thereof. If the x-ray membrane has a surface roughness of 1 nm (Ra: the center-line average roughness) or more, a size defect of 0.2 μm cannot be exactly evaluated, and thus it is not possible to manufacture a mask having high reliability and reduced defect. If the x-ray membrane has a straight scratch of 0.25 μm or more in width on the surface thereof, the film strength is considerably reduced, and thus a reliable x-ray mask cannot be obtained.

In the same point of view, preferably, the x-ray membrane has a surface roughness of 0.8 nm (Ra: the center-line average roughness) or less. More preferably, the surface roughness is 0.6 nm or less. Preferably, the scratch on the surface of the x-ray membrane is 0.2 μm or less in width, in view of film strength.

Herein, the substrate used is a silicon substrate or the like. The x-ray mask blank of the present invention may be one in which the film is constituted of an etching stop layer, an adhesive layer, a reflection preventing layer and a conductive layer disposed between the x-ray membrane and the x-ray absorbing film. Alternatively, the x-ray mask blank may also be one in which a mask layer, a protective layer, and a conductive layer are disposed on the x-ray absorbing film.

By the use of the method according to the fourth through sixth aspects, it is also possible to obtain a silicon carbide film having a surface which has a roughness of 1.0 nm or less in terms of Ra and substantially has no scratch of 0.25 μm or more in width.

According to the method of the fourth aspect, a diamond particle is used as the abrasive material, whereby a flatness of the silicon carbide film is obtained. A relatively small particle is also used as the diamond particle, whereby a scratch of 0.25 μm or more can be prevented. In this case, the diameter of the diamond particle is ⅒ μm (0.1 μm), ⅛ μm (0.12 μm), and ¼ μm (0.25 μm).

According to the method of the fifth aspect, polishing is first performed by using a diamond particle as the abrasive material, and mechanochemical polishing is then performed using colloidal silica as abrasive material, whereby, even if a scratch is made due to the diamond polishing, the scratch can be removed by subsequent mechanochemical polishing. In this case, the diameter of the diamond particle averages 0.05–0.6 μm. For example, it is possible to use a diamond particle having an average diameter of ⅒ μm (0.1 μm), ⅛ μm (0.12 μm), ¼ μm (0.25 μm), and ½ μm (0.5 μm). More specifically, this method is effective using a diamond particle diameter exceeding 0.3 μm, which is prone to make the scratch due to the diamond polishing.

According to the method of the sixth aspect, the mechanochemical polishing using the colloidal silica is employed for preventing scratches. Furthermore, pH of the solution is controlled using hydrogen peroxide ($H_2O_2$), whereby the polishing speed can be increased and the flatness of the film can be improved.

DESCRIPTION OF THE PREFERRED EMBODIMENTS

Referring to FIG. 3, a method of manufacturing an x-ray mask and an x-ray mask blank will be described as well as a method of polishing a silicon carbide film.

[Embodiment 1]

[Formation of x-ray membrane]

In the first place, a silicon carbide film is formed as an x-ray membrane 12 on both surfaces of a silicon substrate 11. The silicon substrate of 4 in. φ in size, of 2 mm in thickness and of a crystalline orientation of (100) is used. The silicon carbide film as the x-ray membrane is also formed to 2.1 μm in thickness by a CVD process by use of dichlorosilane and acetylene. Next, the surface of the x-ray membrane 12 is smoothed by mechanical polishing. The mechanical polishing is performed in the following manner. First, the rear surface of the substrate on which the x-ray membrane 12 is formed is affixed to a stainless (SUS) jig, and the film surface is brought into contact with a solidifying polymer type soft abrasive cloth in which a diamond particle having an average diameter of ⅛ μm (0.05–0.35 μm in diameter: Nihon Engis) is dispersed. Then, a load of 200 g/cm$^2$ is applied to the jig while the jig is rotated at 60 rpm, whereby the surface is polished for five minutes so as to grind the surface to about 0.1 μm in depth, so that the surface having a roughness of 1 nm or less in terms of Ra is obtained. At this time, surface scratches are 0.2 μm or less.

[Formation of x-ray absorbing film]

Figure 1:
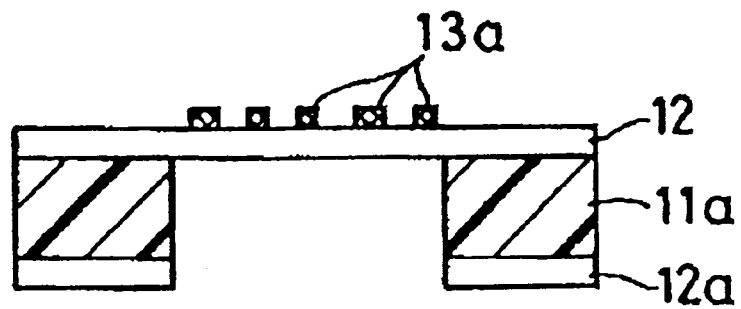
FIG. 1 is a cross sectional view for describing a structure of an x-ray mask.
Figure 2:
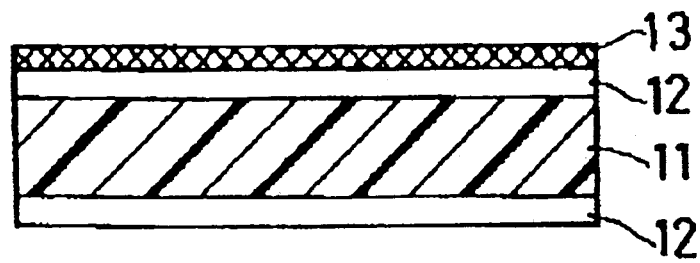
FIG. 2 is a cross sectional view for describing the structure of an x-ray mask blank.
Figure 3A:
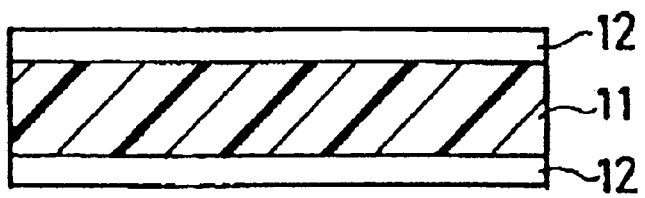
FIG. 3 is an illustration of a method of manufacturing the x-ray mask according to an embodiment of the present invention.
Figure 3B:
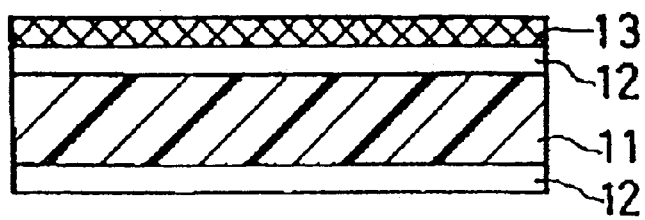

Next, as shown in FIG. 3(B), an x-ray absorbing film 13 of tantalum and boron is formed to 0.5 μm in thickness on the x-ray membrane 12 by a DC magnetron sputtering process. A sintered body containing tantalum and boron in an atomicity ratio (Ta/B) of 8 to 2 is used as a sputter target. Sputter gas is Xe, an RF power density is set at 6.5 W/cm$^2$ and a sputter gas pressure is set at 0.35 Pa. Next, this substrate is annealed at 250° C. for two hours in a nitrogen atmosphere so as to obtain an x-ray absorbing film 13 having a low stress of 10 MPa or less, whereby the x-ray mask blank is manufactured.

[Formation of etching mask layer]

Figure 3C:
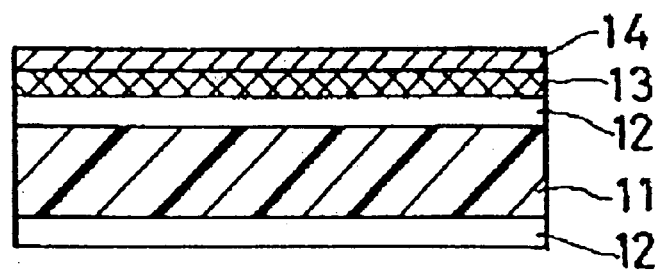
Figure 3D:
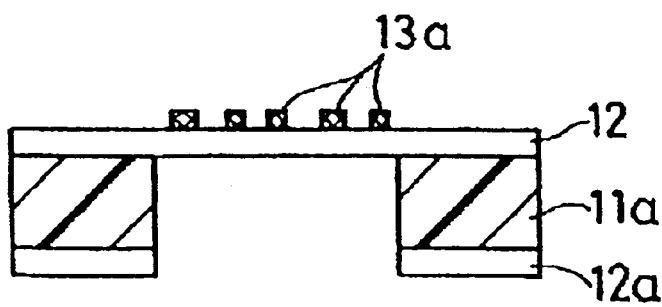

Next, as shown in FIG. 3(C), a chromium film containing chromium carbide is formed as an etching mask layer 14 on the x-ray absorbing film 13 by an RF magnetron sputtering process so that it may be 0.05 μm in thickness. Cr is used as the sputter target, the sputter gas is 7% of methane mixed into Ar, the RF power density is set at 6.5 W/cm$^2$, and the sputter gas pressure is set at 1.2 Pa, thereby obtaining an etching mask layer having low stress of 100 MPa or less. Herein, the etching mask layer is inserted between an EB resist and the x-ray absorbing film, whereby it serves to improve a precision in processing the x-ray absorbing film by a dry etching. The product obtained in this step is also dealt as one type of the x-ray mask blank.

[Formation of x-ray absorbing film pattern and Formation of frame body]

A resist film, on which a desired pattern is formed, is arranged on an x-ray mask blank 2. This pattern is used as the mask so as to perform the dry etching, whereby the x-ray absorbing film pattern is formed. Then, a center area formed on the rear surface, to be a window area of the x-ray membrane 12, is removed by a reactive ion etching (RIE), using 4-fluorocarbon ($CF_4$) as etching gas. The remaining film 12a is then used as the mask so as to etch the silicon substrate 11 by an etching liquid constituted of a mixed liquid of fluoric acid and nitric acid, whereby a silicon frame body 11a is formed and the x-ray mask is thus obtained (see FIG. 3(D)). In this case, an electron beam (EB) resist is generally used, and the pattern is formed by means of an EB lithography.

According to the x-ray mask manufactured by this embodiment, a pattern defect can be 10 or less after the mask processing, and it is possible to achieve by a mask correcting unit an x-ray mask having no defect. It is also confirmed that the film strength is no problem in practice.

[Embodiment 2]

[Formation of x-ray membrane]

In the first place, the silicon carbide film is formed as the x-ray membrane 12 on both surfaces of the silicon substrate 11. The silicon substrate of 4 in. φ in size, of 2 mm in thickness, and crystalline orientation of (100) is used. The silicon carbide film as the x-ray membrane is also formed to 2.1 μm in thickness by the CVD process using dichlorosilane and acetylene. Next, the surface of the x-ray membrane 12 is smoothed by mechanical polishing. The mechanical polishing is performed in the following manner. First, the rear surface of the substrate on which the x-ray membrane 12 is formed is affixed to the stainless (SUS) jig, and the film surface is brought into contact with the solidifying polymer type soft abrasive cloth in which the diamond particle of an average diameter of ¼ μm (0.1–0.6 μm in diameter: Nihon Engis) is dispersed. Then, a load of 200 g/cm$^2$ is applied to the jig while the jig is rotated at 60 rpm, whereby the surface is polished for five minutes so as to obtain a surface roughness of 1 nm or less in terms of Ra. Thus, a scratch of 0.2 μm or more is on the surface of the film. Therefore, moreover, the rear surface of the substrate is fixed to the SUS jig, and the substrate is brought into contact with a suede type (nonwoven fabric type) abrasive cloth in which colloidal silica (its particle diameter: 60–80 nm) is dispersed. Then, a load of 180 g/cm$^2$ is applied to the jig while the jig is rotated at 60 rpm, whereby the surface is polished for five minutes, so that the scratch is reduced to 0.2 μm or less on the surface.

An x-ray mask manufactured by this embodiment, can have a pattern defect of 10 or less after the mask processing. Also, it is possible to use a mask correcting unit and to achieve an x-ray mask having no defect. It is also confirmed that the film strength has no problem in practice.

[Embodiment 3]

This embodiment is the same as the first and second embodiments except that the following mechanochemical polishing is performed for polishing the silicon carbide film, which is the x-ray membrane 12 in the step of forming the x-ray membrane 12 in the first and second embodiments.

The mechanochemical polishing of this embodiment is carried out in the following manner. The substrate is brought into contact with a solidifying polymer type abrasive cloth in which the colloidal silica (its particle diameter: 60–80 nm) is dispersed. Then a load of 180 g/cm$^2$ is applied to the substrate while the substrate is rotated at 60 rpm, whereby the surface is polished for ten minutes. At this time, 30% of $H_2O_2$ is added into colloidal slurry, whereby pH of solvent medium is changed into weak alkali (8.5). In such a manner, a catalytic action gets active, and thus the polishing speed can be increased and the surface can be smoothed.

[Comparison example]

This comparison example is the same as the first embodiment except for the following point. That is, in the step of forming the x-ray membrane 12 in the first embodiment, in the step of polishing the silicon carbide film, which is the x-ray membrane 12, the substrate is brought into contact with the solidifying polymer type soft abrasive cloth in which the diamond particle of an average particle diameter of ½ μm (0.2–0.8 μm in diameter: Nihon Engis) is dispersed. Then, a load of 200 g/cm$^2$ is applied to the jig while the jig is rotated at 60 rpm, whereby the surface is polished for five minutes so as to obtain the surface of the surface roughness of 1 nm or less in terms of Ra. However, a scratch having 0.25 μm or more is on the surface of the thus polished obtained x-ray membrane.

Furthermore, due to the above-described scratch, uncorrectable pattern defect is caused on the finally obtained x-ray mask, and thus the mask of no defect cannot be obtained. Moreover, the film strength is not sufficient in practice, and thus the film is broken due to the repeated use.

Although a compound of Ta and B (Ta/B=8/2) is used as the x-ray absorbing film in the above-mentioned embodiments, this may be replaced by a metal Ta, an amorphous material containing Ta and tantalum boride having a composition other than $Ta_4B$, for example.

Additionally, a structure of the x-ray mask blank is not only the structure of the embodiments but also the so-called membraned structure in which the x-ray membrane is formed on the substrate and the center is then removed from the rear surface of the substrate so as to form the frame body, whereby the x-ray membrane is laminated on this frame body. That is, it may safely be said that a main intermediate product in the step of manufacturing the x-ray mask is the x-ray mask blank.

What is claimed is:

1. An x-ray membrane for an x-ray mask comprising a silicon carbide film having a surface roughness of 1.0 nm or less in terms of Ra (center-line average roughness) and having no scratch of 0.25 μm or more in width.

2. An x-ray mask blank having an x-ray membrane and an x-ray absorbing film on a substrate,
   wherein a silicon carbide film having the surface roughness of 1.0 nm or less in terms of Ra (center-line average roughness) and having no scratch of 0.25 μm or more in width is used as said x-ray membrane.

3. An x-ray mask on which an x-ray absorbing film pattern is formed on an x-ray membrane supported by a frame body,
   wherein a silicon carbide film having the surface roughness of 1.0 nm or less in terms of Ra (center-line average roughness) and having no scratch of 0.25 μm or more in width is used as said x-ray membrane.

4. A method of manufacturing an x-ray mask blank comprising the steps of:
   forming a silicon carbide film as an x-ray membrane on a substrate; and
   polishing the surface of said silicon carbide film by the use of an abrasive material, wherein a diamond whose average particle diameter is 0.05–0.3 μm is used as said abrasive material, whereby the surface of said silicon carbide film is polished so that the surface may have the roughness of 1.0 nm or less in terms of Ra (center-line average roughness) and substantially have no scratch of 0.25 μm or more in width.

5. A method of manufacturing an x-ray mask blank comprising the steps of:

forming a silicon carbide film as an x-ray membrane on a substrate; and polishing the surface of said silicon carbide film by the use of an abrasive material, wherein the surface of said silicon carbide film is polished by the use of the abrasive material constituted of the diamond whose average particle diameter is 0.05–0.6 μm and the surface is then polished by the use of the abrasive material constituted of colloidal silica, whereby the surface of said silicon carbide film is polished so that the surface may have the roughness of 1.0 nm or less in terms of Ra (center-line average roughness) and substantially have no scratch of 0.25 μm or more in width.

6. A method of manufacturing an x-ray mask blank comprising the steps of:

forming a silicon carbide film as an x-ray membrane on a substrate; and polishing the silicon carbide film by the use of an abrasive material, wherein the surface of said silicon carbide film is polished by using colloidal silica dispersed in solution containing hydrogen peroxide ($H_2O_2$) as said abrasive material, whereby the surface of said silicon carbide film is polished so that the surface may have the roughness of 1.0 nm or less in terms of Ra (center-line average roughness) and substantially have no scratch of 0.25 μm or more in width.

7. A method of manufacturing an x-ray mask comprising the steps of:

forming a silicon carbide film as an x-ray membrane on a substrate surface;

polishing the surface of said silicon carbide film by the use of an abrasive material;

wherein a diamond whose average particle diameter is 0.05–0.3 μm is used as said abrasive material, whereby the surface of said silicon carbide film is polished so that the surface may have the roughness of 1.0 nm or less in terms of Ra (center-line average roughness) and substantially have no scratch of 0.25 μm or more in width, forming an x-ray absorbing film on the polished surface of said silicon carbide film;

selectively removing one part of said x-ray absorbing film and forming an x-ray absorbing film pattern; and removing a portion including an area coverage in which said x-ray absorbing film pattern is formed on said substrate and forming said substrate in a shape of a frame body.

8. A method of manufacturing an x-ray mask comprising the steps of:

forming a silicon carbide film as an x-ray membrane on a substrate surface;

polishing the surface of said silicon carbide film by the use of an abrasive material;

wherein the surface of said silicon carbide film is polished by the use of the abrasive material constituted of the diamond whose average particle diameter is 0.05–0.6 μm and the surface is then polished by the use of the abrasive material constituted of colloidal silica, whereby the surface of said silicon carbide film is polished so that the surface may have the roughness of 1.0 nm or less in terms of Ra (center-line average roughness) and substantially have no scratch of 0.25 μm or more in width, forming an x-ray absorbing film on the polished surface of said silicon carbide film;

selectively removing one part of said x-ray absorbing film and forming an x-ray absorbing film pattern; and removing a portion including an area coverage in which said x-ray absorbing film pattern is formed on said substrate and forming said substrate in a shape of a frame body.

9. A method of manufacturing an x-ray mask comprising the steps of:

forming a silicon carbide film as an x-ray membrane on a substrate surface;

polishing the surface of said silicon carbide film by the use of an abrasive material;

wherein the surface of said silicon carbide film is polished by using colloidal silica dispersed in solution containing hydrogen peroxide ($H_2O_2$) as said abrasive material, whereby the surface of said silicon carbide film is polished so that the surface may have the roughness of 1.0 nm or less in terms of Ra (center-line average roughness) and substantially have no scratch of 0.25 μm or more in width, forming an x-ray absorbing film on the polished surface of said silicon carbide film;

selectively removing one part of said x-ray absorbing film and forming an x-ray absorbing film pattern; and removing a portion including an area coverage in which said x-ray absorbing film pattern is formed on said substrate and forming said substrate in a shape of a frame body.

* * * * *